(12) United States Patent
Yuan et al.

(10) Patent No.: US 10,389,380 B2
(45) Date of Patent: Aug. 20, 2019

(54) EFFICIENT DATA PATH ARCHITECTURE FOR FLASH DEVICES CONFIGURED TO PERFORM MULTI-PASS PROGRAMMING

(71) Applicant: SK Hynix Inc., Gyeonggi-do (KR)

(72) Inventors: Wei-Hao Yuan, San Jose, CA (US); Johnson Yen, San Jose, CA (US); ChunHok Ho, San Jose, CA (US)

(73) Assignee: SK Hynix Inc., Gyeonggi-do (KR)

(*) Notice: Subject to any disclaimer, the term of this patent is extended or adjusted under 35 U.S.C. 154(b) by 285 days.

(21) Appl. No.: 15/412,353

(22) Filed: Jan. 23, 2017

(65) Prior Publication Data
US 2017/0310341 A1 Oct. 26, 2017

Related U.S. Application Data

(60) Provisional application No. 62/327,889, filed on Apr. 26, 2016, provisional application No. 62/325,377, filed on Apr. 20, 2016.

(51) Int. Cl.
| | | |
|---|---|---|
| H03M 13/11 | (2006.01) | |
| G11C 29/52 | (2006.01) | |
| G11C 11/56 | (2006.01) | |
| G06F 3/06 | (2006.01) | |
| H03M 13/00 | (2006.01) | |

(Continued)

(52) U.S. Cl.
CPC ....... *H03M 13/1105* (2013.01); *G06F 3/0619* (2013.01); *G06F 3/0655* (2013.01); *G06F 3/0679* (2013.01); *G11C 7/1006* (2013.01); *G11C 7/1084* (2013.01); *G11C 11/5628* (2013.01); *G11C 29/52* (2013.01); *H03M 13/1102* (2013.01); *H03M 13/611* (2013.01); *G06F 3/0629* (2013.01); *G06F 3/0635* (2013.01); *G06F 3/0656* (2013.01); *G06F 2003/0691* (2013.01); *G11C 11/5642* (2013.01); *G11C 14/0018* (2013.01); *G11C 14/0063* (2013.01); *G11C 16/10* (2013.01); *G11C 2211/562* (2013.01); *G11C 2211/5622* (2013.01); *G11C 2211/5642* (2013.01)

(58) Field of Classification Search
CPC . H03M 13/1105; H03M 13/611; G11C 29/52; G11C 14/0018; G11C 14/0063; G11C 11/5628; G11C 11/5642; G11C 2211/562; G11C 2211/5622; G11C 2211/5642; G06F 3/0619; G06F 3/0629; G06F 3/0635; G06F 3/0655; G06F 3/0656; G06F 3/0679

See application file for complete search history.

(56) References Cited

U.S. PATENT DOCUMENTS

| | | | |
|---|---|---|---|
| 9,170,744 B1 | 10/2015 | Smith | |
| 2016/0098319 A1* | 4/2016 | Gorobets | G11C 29/52 714/773 |
| 2016/0118110 A1* | 4/2016 | Kim | G11C 11/5628 365/185.03 |

* cited by examiner

*Primary Examiner* — Kyle Vallecillo
(74) *Attorney, Agent, or Firm* — Kilpatrick Townsend and Stockton

(57) ABSTRACT

Efficient data path architecture for flash devices requiring multi-pass programming utilizes an external memory as an intermediate buffer to store the encoded data used for a first pass programming of the flash device. The stored encoded data can be read from the external memory for subsequent passes programming instead of fetching the data from an on-chip memory, which stores the data received from a host system. Thus, the on-chip memory can be made available to speed up the next data transfer from the host system.

20 Claims, 8 Drawing Sheets

(51) Int. Cl.
*G11C 7/10* (2006.01)
*G11C 14/00* (2006.01)
*G11C 16/10* (2006.01)

300

| WL 302 | PROGRAM NUMBER 304 | | | PROGRAM ORDER 306 | | |
|---|---|---|---|---|---|---|
| | LSB PAGE 304a | CSB PAGE 304b | MSB PAGE 304c | FIRST PASS 306a | SECOND PASS 306b | THIRD PASS 306c |
| WL0 | 0 | 1 | 2 | 0 | 2 | 5 |
| WL1 | 3 | 4 | 5 | 1 | 4 | 8 |
| WL2 | 6 | 7 | 8 | 3 | 7 | 11 |
| WL3 | 9 | 10 | 11 | 6 | 10 | 14 |
| WL4 | 12 | 13 | 14 | 9 | 13 | 17 |
| WL5 | 15 | 16 | 17 | 12 | 16 | 20 |
| WL6 | 18 | 19 | 20 | 15 | 19 | 23 |
| WL7 | 21 | 22 | 23 | 18 | 22 | 26 |
| WL8 | 24 | 25 | 26 | 21 | 25 | 29 |

FIG. 3

EFFICIENT DATA PATH ARCHITECTURE FOR FLASH DEVICES CONFIGURED TO PERFORM MULTI-PASS PROGRAMMING

CROSS-REFERENCES TO RELATED APPLICATIONS

This application is a non-provisional application and claims the benefit and priority of U.S. Provisional Application No. 62/325,377, filed on Apr. 20, 2016, titled "SSD CONTROLLER DATA PATH ARCHITECTURE FOR TLC NAND," and U.S. Provisional Application No. 62/327,889, filed on Apr. 26, 2016, titled "SSD CONTROLLER DATA PATH ARCHITECTURE FOR MULTI-PASS NAND PROGRAMMING," which is herein incorporated by reference in its entirety for all purposes.

BACKGROUND OF THE INVENTION

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' or 'flash memory devices' (e.g., NAND and NOR flash memory devices), are used in media storage, cameras, mobile phones, mobile computers, laptop computers, USB flash drives, etc. Non-volatile memory can provide a relatively reliable, compact, cost-effective, and easily accessible method of storing data when the power is off.

NAND flash devices are generally made up of blocks comprising a number of pages. Each page can comprise multiple NAND flash cells, e.g., hundreds or thousands. A NAND flash cell may be a single level cell (SLC) flash device that can represent one bit per cell, or a multi-level cell (MLC) flash device that can represent two or more bits per cell. For example, a triple-level cell (TLC) NAND flash device can represent three bits per cell. Each cell can hold a voltage to indicate a value stored in physically identical flash cells. For example, an SLC flash device can store one bit of data per cell, e.g., "1" or "0." A triple level cell (TLC) can store three bits of data per cell and hence can support eight possible states, e.g., "111", "110", "101", "100", "011", "010", "001" or "000." It will be understood that the states may represent charge states or voltage levels with reference to the flash memory implementation. Hence, TLC NAND flash devices using multiple levels per cell can be more cost-efficient because the TLC NAND flash devices can allow more bits to be stored as compared to the SLC flash devices, and are generally used for large capacity grade memory.

The TLC NAND flash devices may generally require multi-pass programming which can be complex. In most instances, a TLC NAND flash device may require a specific programming order to transfer the same data to TLC NAND flash device in multiple passes. For example, a specific program order may be required to program the pages within one block. Random page programming may not be allowed. In some instances, a dedicated buffer may need to be allocated for the TLC NAND flash device to store the intermediate data for next step programming. However, the system bandwidth may suffer as the intermediate data has to be retrieved from the buffer to complete programming the pages in the TLC NAND flash device.

BRIEF SUMMARY OF THE INVENTION

Embodiments of the invention pertain to systems, methods, and computer-readable instructions to provide efficient bandwidth utilization of the data path for flash devices requiring multi-pass programming. The embodiments can utilize an external memory as an intermediate buffer to store the encoded data used for a first pass programming of the flash device. The stored encoded data can be read from the external memory for subsequent passes programming instead of fetching the data from an on-chip memory, which stores the data received from a host system. Thus, the on-chip memory can be made available to speed up the next data transfer from the host system.

According to some embodiments, a flash memory device can comprise a flash memory comprising a flash memory block. The flash memory block can comprise a plurality of pages, each page comprising a plurality of M-level cells, wherein each page of data can be programmed into the flash memory in multiple passes by writing same page of data to respective plurality of M-level cells of the flash memory for each of the multiple passes. The flash memory device can further comprise a flash memory controller configured to receive a request from a host system with data to be written into the flash memory, and enable writing of the data into the flash memory in multiple passes for programming a given page. The flash memory device can further comprise a first volatile memory configured to store the data to be written into the flash memory for a first pass, and a second volatile memory configured to store the data to be written into the flash memory for subsequent passes after the first pass. The flash memory device can also comprise a write path comprising an encoder channel configured to encode the data to be written into the flash memory for the first pass, a write back channel configured to store the encoded data into the second volatile memory, and a bypass channel configured to send the encoded data stored in the second volatile memory for writing into the flash memory for the subsequent passes.

According to some embodiments, a method can comprise receiving, by a processor, a request from a host system with data to be written into a flash memory, wherein the data is stored in a first volatile memory. The flash memory can include a flash memory block comprising a plurality of pages, each page comprising a plurality of M-level cells, wherein each page of data can be programmed into the flash memory in multiple passes by writing same page of data to respective plurality of M-level cells of the flash memory for each of the multiple passes. The method further comprises communicating with a buffer manager, communicatively coupled to the processor, to read the data stored in the first volatile memory for a first pass, wherein the buffer manager sends the data read from the first volatile memory through an encoder channel to generate encoded data for programming into the flash memory for the first pass. The method further comprises communicating with the buffer manager to store the encoded data in a second volatile memory to be used for programming into the flash memory for subsequent passes after the first pass. The method further comprises communicating with the buffer manager to read the encoded data from the second volatile memory to program the flash memory for the subsequent passes, wherein the buffer manager sends the encoded data to the flash memory through a bypass channel.

The method can further comprise determining that a ratio of the maximum error rate to the average error rate exceeds a first threshold, and predicting that the flash memory block is going to be a bad block based on the ratio, and if the maximum error rate exceeds a second threshold. The method can further comprise based on the prediction copying data from the flash memory block to a free memory block, and retiring the flash memory block by marking the flash memory block as unusable.

Some embodiments are directed to a non-volatile flash memory controller comprising one or more processors configured to implement various methods. Other embodiments are directed to a computer readable medium having stored thereon instructions that when executed by a processor perform several processes.

BRIEF DESCRIPTION OF THE DRAWINGS

FIG. 3 shows a table illustrating an example programming order for TLC NAND flash devices.

DETAILED DESCRIPTION OF THE INVENTION

Figure 1:
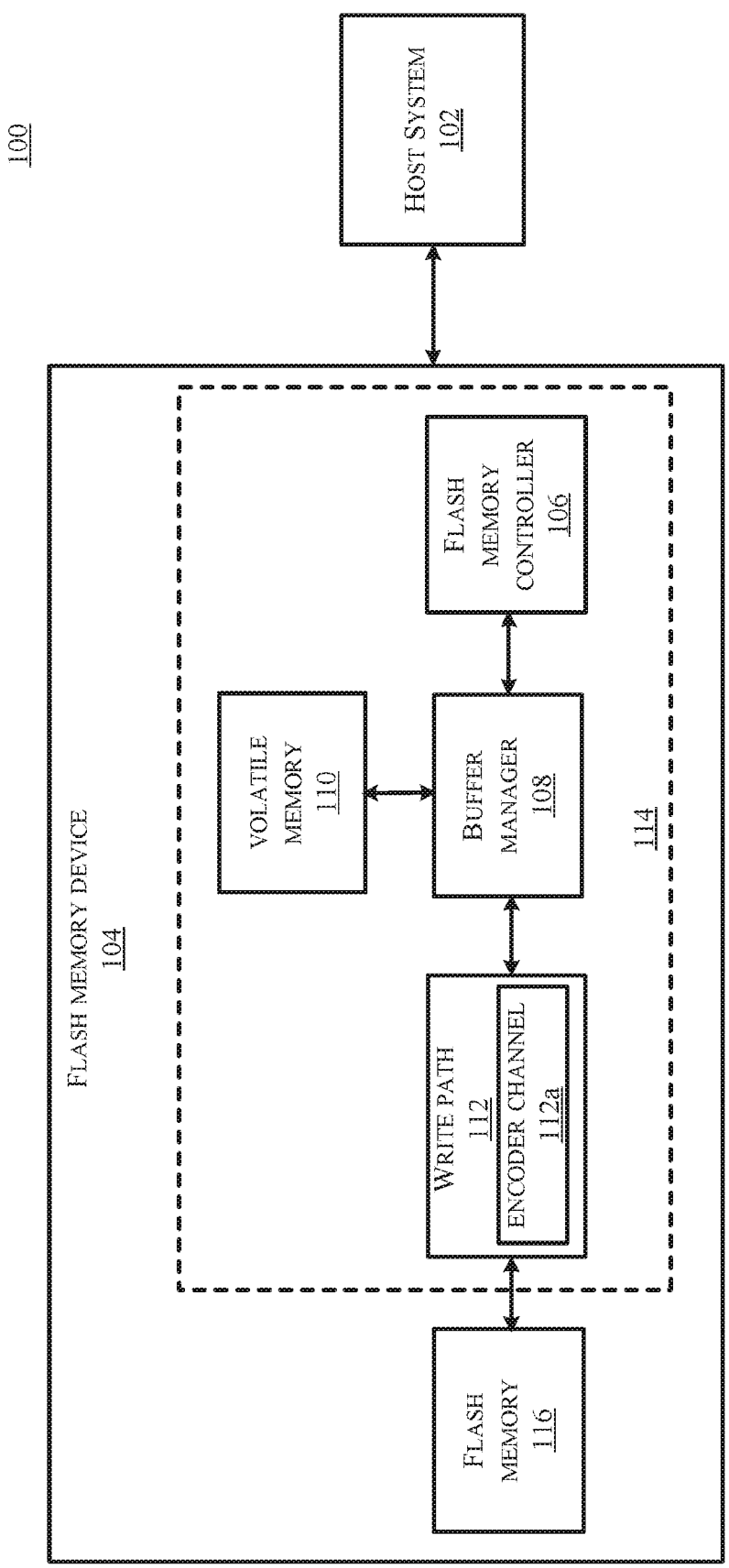
FIG. 1 is a simplified block diagram illustrating a system including a host system coupled to a flash memory device according to some embodiments.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present invention.

Embodiments of the invention pertain to systems, methods, and computer-readable instructions for efficient data path architecture for flash devices that may require multi-pass programming. Methods, systems, and computer-readable media as described in the disclosure can be used, for example, in a TLC NAND flash memory device.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

Certain aspects of the disclosure provide a data path architecture for a flash memory controller to implement efficient multi-pass programming of NAND cells corresponding to a flash memory page, in particular, TLC cells. According to the embodiments, the data path architecture can include a write back channel and a bypass channel to improve over-all system bandwidth using an off-chip volatile memory (e.g., a DRAM) as an intermediate data buffer in addition to an on-chip volatile memory (e.g., an SRAM).

Figure 2:
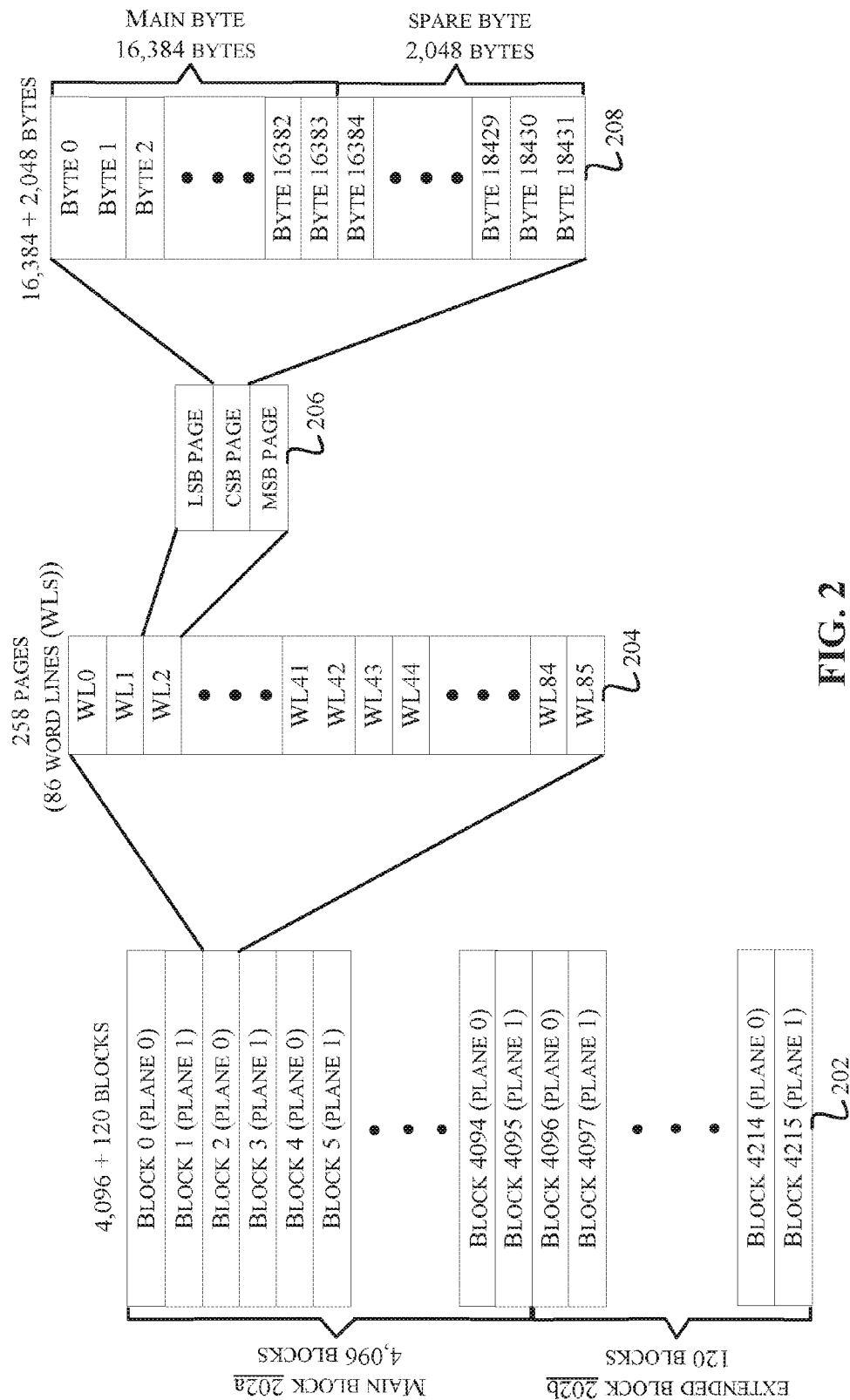
FIG. 2 is an example illustration of a structural organization of the flash memory.
Figure 4:
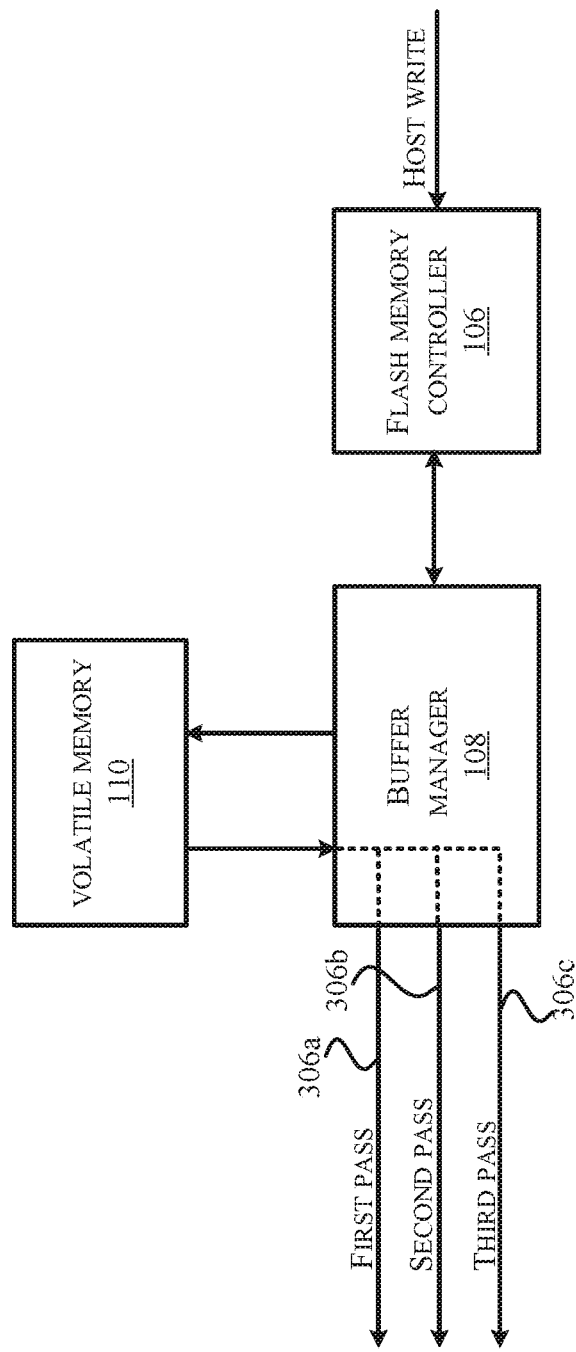
FIG. 4 illustrates a process flow for multi-pass programming of a TLC NAND flash device using a conventional method.
Figure 5:
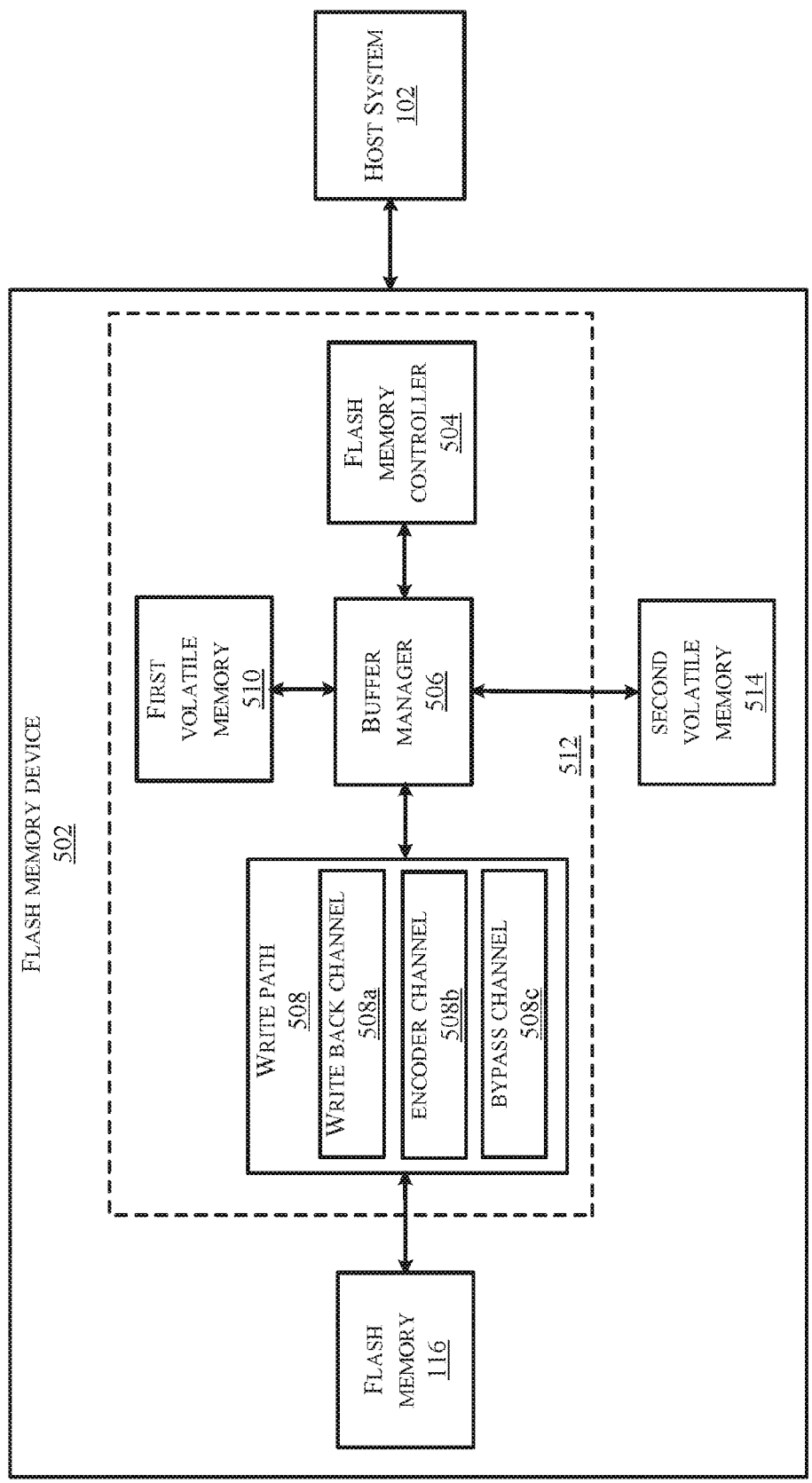
FIG. 5 illustrates a block diagram of a flash memory device, according to some embodiments.

FIG. 1 is a simplified block diagram illustrating a system including a host system coupled to a flash memory device. FIG. 2 illustrates a block diagram of the flash memory device, according to some embodiments. FIG. 3 illustrates an example organization of the L2P front map and L2P back map in one embodiment. FIG. 4 illustrates a table that shows different sizes of the volatile memory based on different configurations of the L2P front map and the L2P back map. FIG. 5 illustrates a method performed by a flash memory controller in one embodiment.

FIG. 1 is a simplified block diagram illustrating a system 100 including a host system 102 coupled to a flash memory device 104. The flash memory device 104 may include a flash memory 116 communicatively coupled to a flash memory controller 106, a buffer manager 108, a volatile memory 110, and a write path 112. In some implementations, the flash memory controller 106, buffer manager 108, volatile memory 110, and the write path 112 may be part of an apparatus 114. For example, the apparatus 114 may be implemented as a system on chip (SoC), an application specific integrated circuit (ASIC), a field programmable gate array (FPGA), or any suitable circuit.

The host system 102 can include any appropriate hardware device, software application, or a combination of hardware and software. In some embodiments, the host system 102 can include a host-side controller (not shown). The host system 102 can send requests to the flash memory device 104 to access the flash memory 116, e.g., to write data into the flash memory 116 or read the data from the flash memory 116.

The flash memory controller 106 may be configured to receive various commands from the host system 102 and communicate with the flash memory 116 based on these commands. The flash memory controller 106 can enable the flash memory 116 to perform various operations based on the commands received from the host system 102 via the buffer manager 108. For example, the host system 102 can communicate with the flash memory controller 106 to program, erase, read, or trim parts of the flash memory 116.

The buffer manager 108 may be configured to manage buffering of the data in the volatile memory 110 to enable multi-pass programming of the flash memory 116 in a specific order. For example, data to be written into the flash memory 116 may be received from the host system 102. In some implementations, the data may be transferred to the volatile memory 110 from the host system 102 via an external interface. The volatile memory 110 may be used as an intermediate buffer to store the data received from the host system 102 for programming the flash memory 116. In general, the volatile memory can refer to any memory media where the stored data is lost in the absence of continuous or substantially continuous power supply. For example, the volatile memory 110 may include a Static Random Access Memory (SRAM). SRAMs can provide faster access times since they may not require refreshing as compared to dynamic random access memories (DRAMs). In addition, the SRAMs can be more compact and can be fabricated on the same die as the buffer manager 108. In some implementations, the buffer manager 108 may be part of the flash memory controller 106.

The write path 112 may provide a channel to program the flash memory 116 or write the data into the flash memory 116. The term "channel" may be used to specify a path between two physical components. It will be understood that the channel may include other physical components. The write path 112 may include an encoder channel 112a. The encoder channel 112a may be configured to encode the data to be written into the flash memory 116. The encoder channel 112a may be used to provide data protection to enable detection and correction of data stored in the flash memory 116. The encoder channel 112a may include any error correcting code (ECC) encoder, e.g., low density parity check (LDPC) encoder. In some implementations, the encoder channel 112a may generate an LDPC parity that may be stored with the encoded data into the flash memory 116, which may be used for error detection and correction of the stored data. In some implementations, there may be a direct memory access (DMA) interface between the flash memory 116 and the write path 112. In some implementations, the write path 112 may include synchronization logic for synchronizing different clock domains between the flash memory 116 and different components of the apparatus 114. For example, synchronization logic may include a synchronizer for the DMA flash interface between the flash memory 116 and the encoder channel 112a. In some implementations, the write path 112 may include a write path memory buffer to buffer the data for writing into the flash memory 116.

In some implementations, the flash memory 116 can be any non-volatile memory, e.g., a NAND flash. In some implementations, the flash memory 116 can be a NOR flash memory configured to interact externally as a NAND flash. The flash memory 116 can be designed to store data in the absence of a continuous or substantially continuous external power supply. In some examples, the flash memory 116 can be used for secondary data storage, e.g., in a computer system such as a laptop. In such examples, the flash memory device 104 can replace a magnetic hard disk drive (HDD). In some examples, the flash memory controller 106 can be external to the flash memory device 104. In some such examples, the flash memory controller 106 can interact with a plurality of flash memories. In some embodiments, other non-volatile memory can be used in place of or in addition to the flash memory 116. Examples can include read only memory (ROM), a mask ROM (MROM), a programmable ROM (PROM), an erasable programmable ROM (EPROM), an electrically erasable programmable ROM (EEPROM), Ferroelectric RAM (F-RAM), Magnetoresistive RAM (RAM), polymer-based organic memory, holographic memory, phase change memory and the like. An example structural organization of a flash memory, such as the flash memory 116, is explained with reference to FIG. 2.

FIG. 2 is an example illustration of the organization of the flash memory 116. It is to be noted that a structure 200 shown in FIG. 2 is for illustrative purposes only and the actual physical organization of the flash memory 116 can differ substantially from the depiction.

In some implementations, the flash memory 116 may be implemented as a two dimensional matrix of NAND flash cells, called blocks, comprising pages (rows) and strings (columns). Within a block, all the cells in the same row can share a word line (WL). A flash memory die can comprise a plurality of blocks 202 that may include a main block 202a and an extended block 202b. In some implementations, the main block 202a may be used to store data, and the extended block 202b may be used to store auxiliary information, e.g., error correction codes, metadata related to block management (e.g., erase cycle counters, logical address information, bad block marks), etc. The plurality of blocks 202 may include blocks that can be on different planes. In the example shown in FIG. 2, there can be two planes, plane 0 and plane 1, but other examples can include different number of planes per die. A plurality of such dies can be included in a flash memory, such as the flash memory 116. Plane 0 can include a first set of blocks, e.g., block 0, block 2, block 4, . . . , block 4214. Plane 1 can include a second set of blocks, e.g., block 1, block 3, block 5, . . . , block 4215. In the example shown in FIG. 2, the main block 202a may include 4,096 blocks and the extended block 202b may include 120 blocks. In most implementations, a block may represent the smallest erasable unit.

Each block can include a plurality of word lines. As shown in FIG. 2, a block 2 on plane 0 may include plurality of word lines 204. For example, the word lines 204 may include 86 word lines that may be equivalent to 258 pages (e.g., three pages for each word line). Generally, in a TLC NAND flash device, the three bits within a single cell are not mapped to the same page. For example, all the most significant bits (MSBs) on a word line can form an MSB page, all the center significant bits (CSBs) on the word line can form a CSB page, and all the least significant bit (LSBs) on the word line can form an LSB page. As shown in FIG. 2, a word line 206 represented by WL2 may correspond to an LSB page, a CSB page and an MSB page. The MSB page may include the MSBs associated with all the cells on the WL2, the CSB page may include the CSBs associated with all the cells on the WL2, and the LSB page may include the LSBs associated with all the cells on the WL2. Each page may store a plurality of bytes that may include bytes for main data and bytes for auxiliary data. For example, the CSB page from the word line 206 may include bytes 208 comprising main bytes and spare bytes. In the example shown in FIG. 2, the CSB page from the word line 206 may include 16,384 main bytes and 2,048 spare bytes. Each page in a flash memory may represent the minimum programmable unit or the minimum readable unit. In this specification, programming or writing of a flash memory may be used interchangeably. Programming a page may be interpreted as bringing the voltage level of each cell on that page to one of the possible states based on the write data.

TLC NAND flash devices generally provide a higher cell density as compared to SLC and MLC flash devices, are cost effective, and therefore are mostly used in mass storage consumer applications. However, programming of a TLC NAND flash device can be complex since same data may need to be programmed multiple times in the TLC NAND flash device using a specific programming order. For example, the TLC NAND flash device is generally programmed on a page basis, and each page can only be programmed once before being erased. The pages in the flash memory 116 can be programmed in a sequential order for each block, also called in-page-order programming. For example, contents of the page register can be programmed into the flash array specified by the row address. Generally, the MSB page, CSB page and the LSB page can be programmed and read at different times for each word-line. This is further explained with reference to FIG. 3.

FIG. 3 shows a table 300 illustrating an example programming order for TLC NAND flash devices.

A program number 304 illustrates programming of an LSB page 304a, a CSB page 304b and an MSB page 304c for each word line 302. For example, word lines WL0, WL1, WL2, WL3, WL4, WL5, WL6, WL7 and WL8 may be part of the word lines 204 as discussed with reference to FIG. 2. The LSB page 304a, CSB page 304b and the MSB page 304c may be similar to the LSB page, CSB page and the MSB page as described with reference to the word line 206 in FIG. 2. In most instances, the LSB page 304a, CSB page 304b and the MSB page 304c for each word line are programmed in a sequential order as shown by the program number 304. For example, for WL0, first the LSB page 304a is programmed, second the CSB page 304b is programmed, and third the MSB page 304c is programmed. Same sequence repeats for WL1, WL2, . . . , WL8.

Generally, programming of pages within one block of a TLC NAND flash device may require the same data to be programmed in multiple passes using a specific programming order. Programming of random pages within a block may not be allowed. As shown by a program order 306 in FIG. 3, the WL0 is programmed at time 0 shown by a first pass 306a, at time 2 shown by a second pass 306b, and at time 5 shown by a third pass 306c. Similarly, the WL1 is programmed at time 1 shown by the first pass 306a, at time 4 shown by the second pass 306b, and at time 8 shown by the third pass 306c. Programming for the other word lines WL2, WL3, . . . , WL8 can follow the order as shown by the program order 306 for the respective word line. Generally, data from the three pages in one word line can be read only after the third program cycle. For example, data from the three pages in the WL0 can be read only after time 5. Data in the last word line can only be read out after the third program cycle is finished.

FIG. 4 illustrates a process flow 400 for multi-pass programming of a TLC NAND flash device using a conventional method.

The host system 102 may send a request to the flash memory device 104 for programming a page in the flash memory 116. For example, the page may be the LSB page in the word line 206. The host system 102 may provide an address (e.g., a linear block address) where the data is to be written into the flash memory 116. The data may be stored in the volatile memory 110. The flash memory controller 106 may instruct the buffer manager 108 to read the data from the volatile memory 110 for sending the data to the flash memory 116 through the write path 112. Thus, the data may get encoded for each pass through the encoder channel 112a.

For traditional TLC NAND flash devices, the bandwidth for the volatile memory 110 is generally shared by one host write and three data path reads as shown in FIG. 4. For example, the buffer manager 108 may read the data three times from the volatile memory 110 for programming flash cells three times for a given page of a flash memory block in the flash memory 116. For example, as shown in FIG. 4, the buffer manager 108 may read the data first time from the volatile memory 110 to perform a first flash memory write for the first pass 306a. Referring back to FIG. 3, the buffer manager 108 may read the data from the volatile memory 110 to program WL0 at time 0 for the first pass 306a. Next, the buffer manager 108 may read the data second time from the volatile memory 110 to perform a second flash memory write for the second pass 306b. Referring back to FIG. 3, the buffer manager 108 may read the data from the volatile memory 110 to program WL0 at time 2 for the second pass 306b. Finally, the buffer manager 108 may read the data third time from the volatile memory 110 to perform a third flash memory write for the third pass 306c. Referring back to FIG. 3, the buffer manager 108 may read the data from the volatile memory 110 to program WL0 at time 5 for the third pass 306c. Since most data transfers between the flash memory device 104 and the host system 102 may go through the volatile memory 110, the data transfer bandwidth for accesses to the volatile memory 110 by the host device 102 may need to be shared for multi-pass programming of the flash memory 116. This can jeopardize overall data transfer bandwidth of the system.

Certain embodiments of the invention can utilize an off-chip volatile memory, e.g., a DRAM, as an intermediate buffer in addition to the volatile memory 110 to improve the overall system bandwidth by distributing the data traffic using the two volatile memories. Buffering the encoded data in the DRAM for next step programming can allow releasing the volatile memory 110 to accelerate the next data transfer with the host system 102. This is further explained with reference to FIG. 5.

FIG. 5 illustrates a block diagram 500 of a flash memory device 502 coupled to the host system 102, according to some embodiments. The flash memory device 502 may include a flash memory controller 504 communicatively coupled to a buffer manager 506. The buffer manager 506 may be communicatively coupled to a first volatile memory 510, a write path 508 and a second volatile memory 514. It is to be noted that the structure shown in FIG. 5 is for illustrative purposes only and the actual physical organization of the flash memory device 502 can differ substantially from the depiction. In some implementations, the flash memory controller 504, buffer manager 506, first volatile memory 510, and the write path 508 may be part of an apparatus 512. For example, the apparatus 512 may be implemented as an SoC, an ASIC, an FPGA, or any suitable circuit. In this specification, devices that are implemented as part of the apparatus 512 may be called on-chip devices, and devices that are implemented external to the apparatus 512 may be called off-chip devices. For example, in some implementations, the flash memory 116 or the second volatile memory 514 may be off-chip devices relative to the apparatus 512. It will be understood that the apparatus 512 may include other components as deemed suitable for the implementation of the flash memory device 502.

The first volatile memory 510 may be similar to the volatile memory 110 as discussed with reference to FIG. 1. For example, the first volatile memory 510 may include a faster and a compact memory such as an SRAM. In some implementations, the first volatile memory 510 can be fabricated on the same die as the buffer manager 506. In some embodiments, the second volatile memory 514 can be a dynamic random access memory (DRAM). Generally, the DRAM may be less expensive than the SRAM since the DRAM implementation may require less number of transistors than the SRAM. Thus, the second volatile memory 514 may have more storage capacity than the first volatile memory 510 for the same number of transistors. In some implementations, the second volatile memory 514 may be part of the main memory for the system. In some embodiments, the apparatus 512 may include an on-chip memory controller (not shown) to communicate with the second volatile memory 514. For example, the memory controller may be communicatively coupled to the buffer manager 506 and the second volatile memory 514. In some implementations, the memory controller may be part of the buffer manager 506.

The write path 508 may include additional channels than the write path 112 described with reference to the flash memory device 104 in FIG. 1. The write path 508 may include a write back channel 508a, an encoder channel 508b and a bypass channel 508c. According to some embodiments, the write path 508 may be used to distribute the data traffic between the flash memory 116 and the first volatile memory 510 using the second volatile memory 514 via the buffer manager 506. As discussed with reference to FIG. 1, in some implementations, the write path 508 may also include synchronization logic for synchronizing different clock domains between the flash memory 116 and different components of the apparatus 512. For example, synchronization logic may include synchronizers for DMA flash interface between the flash memory 116, and the encoder channel 508b or the bypass channel 508c. In some implementations, the write path 508 may include a write path memory buffer to buffer the data for writing into the flash memory 116.

The encoder channel 508b may be similar to the encoder channel 112a. For example, the encoder channel 508b may be configured to encode the data read from the first volatile memory 510 by the buffer manager 506 to provide the encoded data for writing into the flash memory 116. The encoder channel 508b may include the LDPC encoder or any suitable ECC encoder. In some implementations, the encoder channel 508b may generate an LDPC parity for error detection and correction of the stored data. The LDPC parity may be stored with the encoded data into the flash memory 116.

Instead of reading the data from the first volatile memory 510 for the next step programming of the flash memory 116, as is generally done in conventional flash memory devices, certain embodiments can allow reading the encoded data from the second volatile memory 514, thus making the first volatile memory 510 available for next data transfer with the host system 102. In some embodiments, the write back channel 508 may be configured to enable storing of the encoded data used for the first pass programming into the second volatile memory 514 for subsequent pass programming. For example, the encoded data used for the first pass programming of the flash memory 116 can be written back to the second volatile memory 514 by the write back channel 508a via the buffer manager 506.

In some embodiments, the bypass channel 508c may be used to bypass encoding of the data to be written into the flash memory 116 for subsequent passes after the first pass. For example, the subsequent passes may include a second pass and a third pass for a TLC NAND flash device. In some embodiments, the buffer manager 506 may read the encoded data stored in the second volatile memory 514, which was used for programming a page of the flash memory 116 for a first pass, and send it to the flash memory 116 via the bypass channel 508c for programming the same page for the next pass. In some embodiments, the encoded data stored in the second volatile memory 514 can be read multiple times by the buffer manager 506 and can be sent to the flash memory 116 via the bypass channel 508c for multi-pass programming of the same page.

The flash memory controller 504 may be configured to receive instructions from the host system 102 and can accordingly provide instructions to the buffer manager 506 for managing the data traffic between the write path 508, the first volatile memory 510 and the second volatile memory 514. For example, the flash memory controller 504 may receive a request from the host system 102 with data to be written into the flash memory 116. The flash memory controller 504 can enable writing of the data into the flash memory 116 in multiple passes for programming a given page of the flash memory 116. The data may be stored in the first volatile memory 510. For example, in some implementations, the data may be transferred to the first volatile memory 510 from the host system 102 via an external interface. The flash memory controller 504 may be configured to communicate with the buffer manager 506 to read the data from the first volatile memory 510 for sending the data to the flash memory 116 through the encoder channel 508b for a first pass programming. The flash memory controller 504 may also be configured to communicate with the buffer manager 506 to store the encoded data into the second volatile memory 514 via the write back channel 508a for subsequent pass programming. Once the encoded data is stored in the second volatile memory 514, the first volatile memory 510 can be released for next data transfer with the host system 102. The flash memory controller 504 may further be configured to communicate with the buffer manager 506 to read the encoded data from the second volatile memory 514 for writing into the flash memory 116 via the bypass channel 508c for subsequent pass programming. In some embodiments, programming of the flash memory 116 for the subsequent passes after the first pass may be based on the program order 306, as discussed with reference to FIG. 3.

The buffer manager 506 may be configured to receive instructions from the flash memory controller 506 to distribute the data traffic between the first volatile memory 510, second volatile memory 514 and the write path 508. In some embodiments, the buffer manager 506 may communicate with the first volatile memory 510 and the second volatile memory 514 via their respective memory controllers (not shown). The buffer manager 506 may be implemented in hardware, software or a combination thereof. In some implementations, functionality of the buffer manager 506 may be integrated with the flash memory controller 504.

Figure 6:
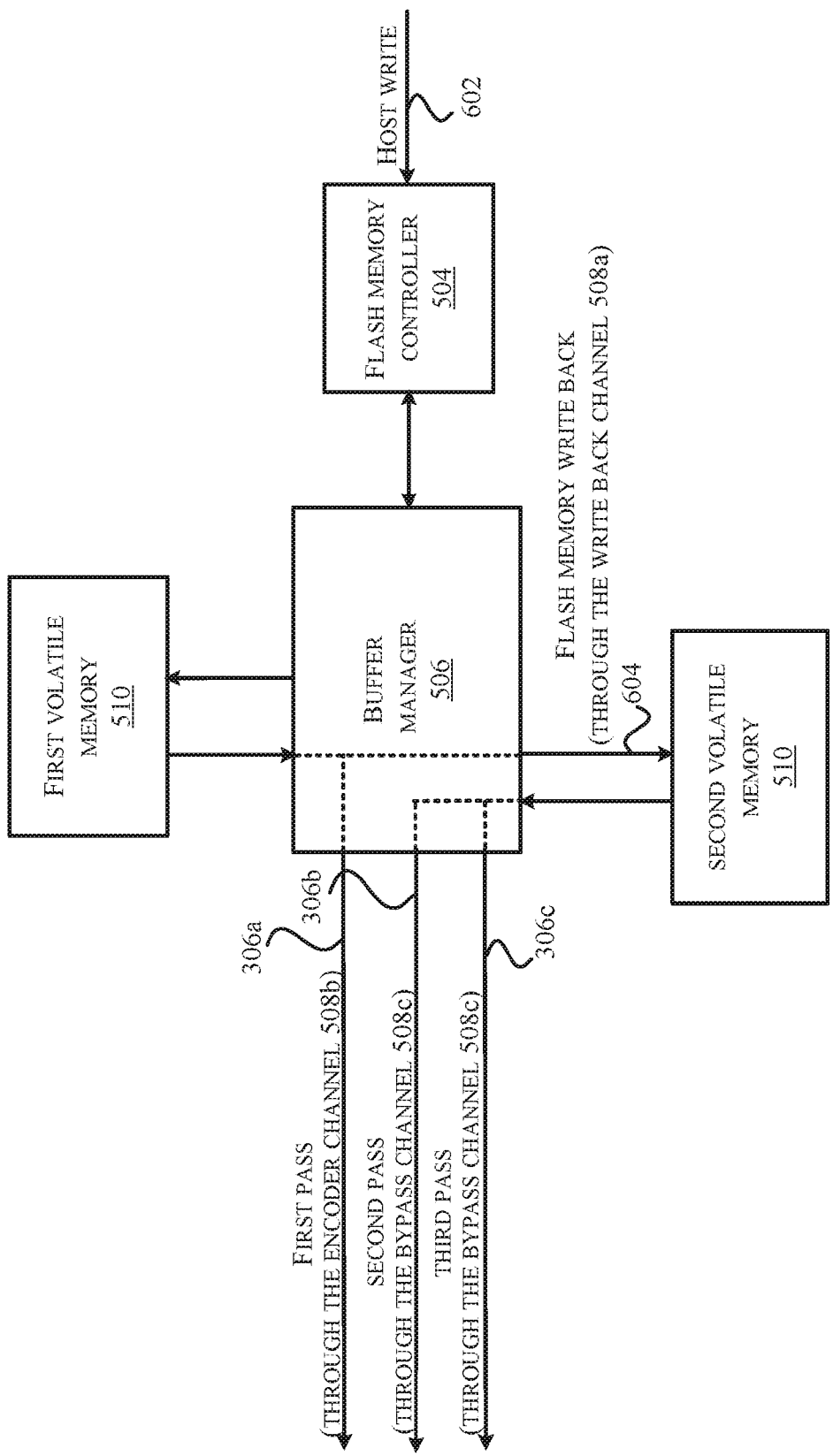
FIG. 6 illustrates a process flow for multi-pass programming of a TLC NAND flash device according to some embodiments.

FIG. 6 illustrates a process flow 600 for multi-pass programming of a TLC NAND flash device according to some embodiments.

As discussed with reference to FIG. 5, the host system 102 may send a request to the flash memory device 502, as indicated by a host write 602, for writing data into the flash memory 116. The data provided by the host system 102 for the write request may be stored in the first volatile memory 510. According to some embodiments, the flash memory controller 504 may instruct the buffer manager 506 to distribute the data traffic between the first volatile memory 510 and the second volatile memory 514 using the write back channel 508a and the bypass channel 508c. For example, the flash memory controller 504 may communicate with the buffer manager 506 to read the data from the first volatile memory 510 and provide the data to the flash memory 116 through the encoder channel 508b for the first pass 306a. For example, referring back to FIG. 3, the buffer manager 506 may read the data from the first volatile memory 510 at time 0 to program WL0 for the first pass 306a. The encoded data may be stored in the second volatile memory 514, as shown by a flash memory write back 604, through the write back channel 508a for the subsequent pass programming.

In some embodiments, the flash memory controller 504 may communicate with the buffer manager 506 to read the stored encoded data from the second volatile memory 514 and provide the encoded data to the flash memory 116 through the bypass channel 508c for subsequent passes after the first pass, e.g., the second pass 306b and the third pass 306c. For example, referring back to FIG. 3, the buffer manager 506 may read the encoded data from the first volatile memory 510 at time 2 to program WL0 for the second pass 306b, and at time 5 to program WL0 for the third pass 306c. Thus, the embodiments can provide efficient data path architecture for multi-pass programming of the flash memory 116 using the write back channel 508a, bypass channel 508c and the second volatile memory 514. In some embodiments, for the TLC NAND flash devices, the bandwidth for the first volatile memory 510 is generally shared by one host write and one data path read, while the bandwidth for the second volatile memory 514 is shared by one data path write and two data path reads. Assuming maximum system bandwidth as "Max", the overall bandwidth in certain embodiments can include "Max/2" for the first volatile memory 510 and "Max/3" for the second volatile memory 514. Hence, certain embodiments can provide 33% improvement in system bandwidth over the traditional systems. For example, the system bandwidth for the flash memory device 104 as discussed with reference to FIG. 4 can be calculated as "Max/4" including one host write and three data path reads. In comparison, the system bandwidth for the flash memory device 502 as discussed with reference to FIG. 6 can be calculated as "Max/3" for one data path write and two data path reads for the second volatile memory 514. Hence, utilizing the second volatile memory 514 for storing the encoded data for multiple passes can improve bandwidth utilization of the first volatile memory 510, which can be made available to speed up the communication with the host system 102 for the next data transfer.

Figure 7:
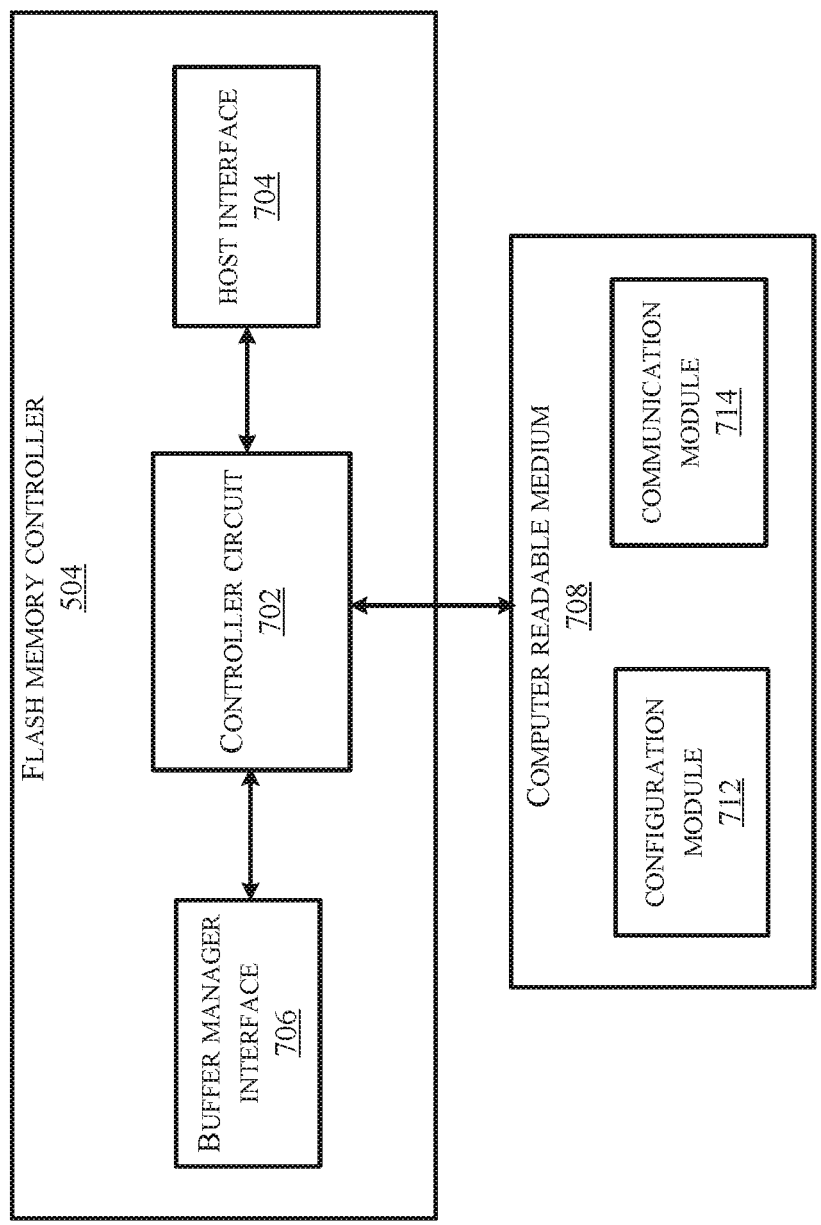
FIG. 7 illustrates a block diagram of the flash memory controller communicatively coupled to a computer readable medium in one embodiment.

FIG. 7 illustrates a block diagram 700 of the flash memory controller 504 communicatively coupled to a computer readable medium 708, according to one embodiment.

In some implementations, the flash memory controller 504 may include a controller circuit 702 coupled to a buffer manager interface 706 and a host interface 704. It is to be noted that the structure shown in FIG. 7 is for illustrative purposes only and the actual components of the flash memory controller 504 can differ substantially from the depiction.

The host interface 704 can be used to communicate with a host, such as the host system 102. The host interface 704 can include elements (e.g., hardware, software, firmware or any combination thereof) necessary for supporting a host interface protocol. In some implementations, the host interface 704 may include an external interface to transfer data to the first volatile memory 510 from the host system 102 for write requests to the flash memory 116.

The buffer manager interface 706 can be used to interface with the buffer manager 506. For example, as discussed with reference to FIGS. 5 and 6, the flash memory controller 504 may communicate with the buffer manager 506 to enable the multi-pass programming of the flash memory 116 based on a write request received from the host system 102 via the host interface 704.

The controller circuit 702 can refer to any processing logic, including but not limited to a processor or processing core associated with a processor, Application Specific Integrated Circuit (ASIC), Field Programmable Gate Array (FPGA), or any other circuitry configurable to execute instructions. In some embodiments, the instructions may be stored on the computer-readable storage medium 708, e.g., in the form of a computer program.

The computer readable medium 708 may be in the form of a memory. The computer-readable storage medium 708 may be non-transitory. In some embodiments, the computer-readable storage medium 708 may include but is not limited to, SRAM, DRAM, read only memory (ROM), electrically erasable programmable read-only memory (EEPROM), or any other medium which can be used to store the desired information and which can be accessed by the controller circuit 702. The computer readable medium 708 may be on-chip or off-chip to the apparatus 512.

In some implementations, the computer readable medium 708 may include a configuration module 712 and a communication module 714. The configuration module 712 may be used to store various configurations associated with the flash memory 116, and any other relevant configurations. For example, the configuration module 712 may store information associated with the program order 306 for multiple pass programming of the flash memory 116, as discussed with reference to the table 300 in FIG. 3. In some implementations, the configuration module 712 may also store information associated with the multiple passes (e.g., number of passes) required for programming a page of a flash memory 116.

In some implementations, the communication module 714 may be configured to communicate with the host system 102 via the host interface 704. For example, the communication module 714 may receive a request from the host system 102 via the host interface 704 with data to be written into the flash memory 116. The communication module 714 may also be configured to communicate with the buffer manager 506 via the buffer manager interface 706 to manage the data traffic between the first volatile memory 510, second volatile memory 514 and the write path 508. For example, the communication module 714 may communicate with the buffer manager 506 to read the data stored in the first volatile memory 510 for the first pass 306a. The communication module 714 may also communicate with the buffer manager 506 to store the encoded data in the second volatile memory 514 to be used for programming into the flash memory 116 for subsequent passes after the first pass. The communication module 714 may also communicate with the buffer manager 506 to read the encoded data from the second volatile memory 514 to program the flash memory 116 for the subsequent passes, e.g., the second pass 306b and the third pass 306c as discussed with reference to FIG. 6.

Figure 8:
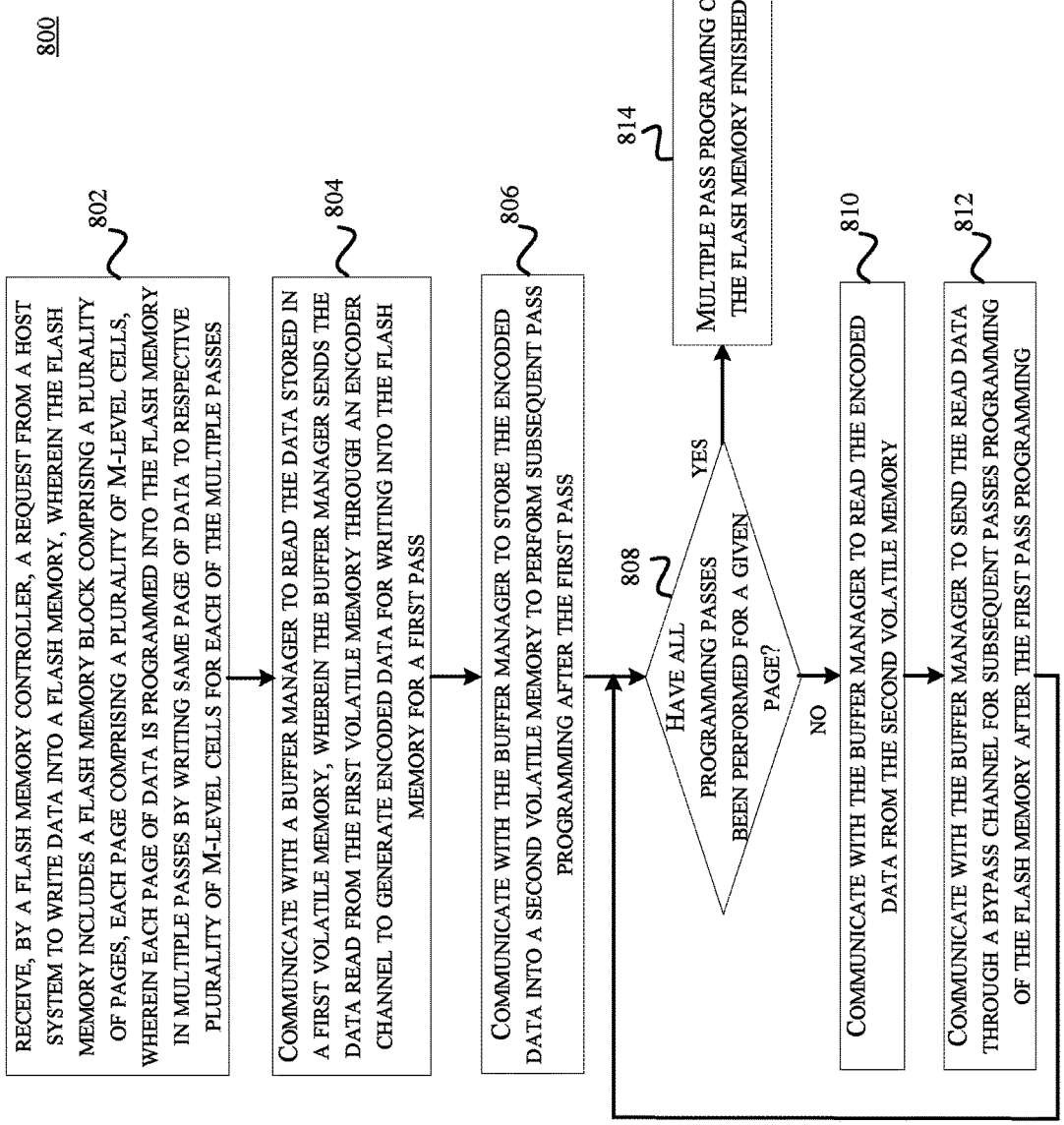
FIG. 8 illustrates a method to perform multi-pass programming of a flash memory device in some embodiments.

FIG. 8 illustrates a method 800 to perform multi-pass programming of a flash memory device in some embodiments. The method may be performed by the flash memory controller 504. For example, the controller circuit 702 (or a processor in the controller circuit) may execute instructions stored in the computer readable medium 708 to perform the multi-pass programming of the flash memory device 502, as discussed with reference to FIGS. 5-7.

In step 802, a flash memory controller may receive a request from a host system to write data into a flash memory. The flash memory may include a flash memory block comprising a plurality of pages, each page comprising a plurality of M-level cells, wherein each page of data is programmed into the flash memory in multiple passes by writing same page of data to respective plurality of M-level cells of the flash memory for each of the multiple passes. For example, for TLC NAND flash devices, the M can be three. Referring back to FIG. 5, the flash memory controller 504 may receive a request from the host system 102 to write data into the flash memory 116. For example, the request may be received using the communication module 714 via the host interface 704. The flash memory 116 may include the flash memory block 204 comprising a plurality of pages associated with the word lines WL0, WL1, . . . , WL85. For example, the word line 206 can include an LSB page, a CSB page and an MSB page. Each page may include triple level cells, wherein each page of data is programmed into the flash memory 116 in three passes by writing same page of data to respective plurality of triple-level cells of the flash memory 116 for each of the three passes. The data for the write request may be stored in the first volatile memory 510. For example, the first volatile memory 510 may include an SRAM. In some implementations, the data may be transferred to the first volatile memory 510 from the host system 102 via the host interface 704.

In step 804, the flash memory controller may communicate with a buffer manager to read the data stored in a first volatile memory. The buffer manager may send the data read from the first volatile memory through an encoder channel to generate encoded data for writing into the flash memory for a first pass. Referring back to FIG. 5, the flash memory controller 502 may communicate with the buffer manager 506 to read the data stored in the first volatile memory 510. For example, the flash memory controller 502 may communicate with the buffer manager 506 using the communication module 714 via the buffer manager interface 706. The buffer manager 506 may read the data from the first volatile memory 510 and send the read data through the encoder channel 508b to generate encoded data for writing into the flash memory 116 for the first pass programming. The encoder channel 508b may include an LDPC encoder or any suitable ECC encoder. In some implementations, the encoder channel 508b may generate an LDPC parity that may be stored with the data into the flash memory 116, which may be used for error detection and correction of the stored data.

In step 806, the flash memory controller may communicate with the buffer manager to store the encoded data into a second volatile memory to perform subsequent pass programming after the first pass. Referring back to FIG. 5, the flash memory controller 502 may communicate with the buffer manager 506 to store the encoded data into the second volatile memory 514. For example, the encoded data may be provided by the encoder channel 508b and can be stored in the second volatile memory 514 using the write back channel 508a. As shown in FIG. 6, the encoded data used for programming the flash memory 116 for the first pass 306a can be stored in the second volatile memory 514 for the flash memory write back 602 for programming for the subsequent passes through the write back channel 508a. In some embodiments, once the encoded data for the first pass 306a has been written into the flash memory 116, or has been stored in the second volatile memory 514, space used by the first volatile memory 510 used for storing the data for the first pass can be released to speed up the next data transfer with the host system 102.

In step 808, the flash memory controller may determine if all the programming passes have been performed for a given page. For example, the flash memory controller 502 may determine if the flash memory 116 comprising triple level cells has been programmed three times for a given page. In some embodiments, the information stored in the configuration module 712 may be used to determine the number of passes required to program the given page of the flash memory 116.

In step 810, the flash memory controller may communicate with the buffer manager to read the encoded data from the second volatile memory. Referring back to FIG. 5, the flash memory controller 502 may communicate with the buffer manager 506 to read the encoded data stored in the second volatile memory 514.

In step 812, the flash memory controller may communicate with the buffer manager to send the read data through a bypass channel for subsequent passes programming of the flash memory after the first pass programming. Referring back to FIG. 5, the flash memory controller 502 may communicate with the buffer manager 506 to send the data read from the second volatile memory 514 through the bypass channel 508c for programming for the subsequent passes after the first pass programming of the flash memory 116. For example, the flash memory controller 502 may communicate with the buffer manager 506 to send the data read from the second volatile memory 514 through the bypass channel 508c for programming of the flash memory 116 for the second pass 306b, as discussed with reference to FIG. 6. In some embodiments, the subsequent pass programming may be based on the program order 306 as discussed with reference to FIG. 3.

The method 800 will loop back to the step 808 to determine whether all the programming passes have been performed for the given page. For example, if the flash memory device 502 requires three pass programming, the steps 810 and 812 may be executed again if only two passes have been programmed. In the step 810, the flash memory controller 502 may communicate again with the buffer manager 506 to read the encoded data stored in the second volatile memory 514, and in the step 812, the flash memory controller 502 may communicate with the buffer manager 506 to send the data read from the second volatile memory 514 through the bypass channel 508c for programming the flash memory 116 for the third pass 306c, as discussed with reference to FIG. 6. Thus, in certain embodiments, utilizing the second volatile memory 514 to store the encoded data for the subsequent passes can improve the overall system bandwidth by distributing the data traffic to one or more intermediate buffers. In some embodiments, space used by the first volatile memory 510 for storing the data for subsequent pass programming can be released to be allocated for next data transfer with the host system 102 thus accelerating the data transfer with the host system 102.

The method 800 will loop back to the step 808 again to determine whether all the programming passes have been performed for the given page. If all three passes have been performed, the multiple pass programming of the flash memory may be finished as shown in step 814.

As compared to conventional TLC NAND flash devices which use only SRAM as an intermediate buffer to store data for next step programming, embodiments of the invention can provide efficient data architecture by utilizing an off-chip DRAM as an additional buffer to store the encoded data for the next step programming. Utilizing the DRAM can provide improved overall system bandwidth by distributing the data traffic between the on-chip SRAM and the off-chip DRAM.

What is claimed is:
1. A flash memory device comprising:
a flash memory comprising:
   a flash memory block comprising a plurality of pages, each page comprising a plurality of M-level cells, wherein each page of data is programmed into the flash memory in multiple passes by writing a same page of data to a respective page of the plurality of M-level cells of the flash memory for each of the multiple passes;
a flash memory controller configured to:
   receive a request from a host system with data to be written into the flash memory; and
   enable writing of the data into the flash memory in multiple passes for programming a given page;
a first volatile memory configured to store the data to be written into the flash memory for a first pass;
a second volatile memory configured to store the data to be written into the flash memory for subsequent passes after the first pass; and
a write path comprising:
   an encoder channel configured to encode the data to be written into the flash memory for the first pass from the first volatile memory while bypassing the second volatile memory;
   a write back channel configured to store the encoded data into the second volatile memory; and
   a bypass channel configured to send the encoded data stored in the second volatile memory for writing into the flash memory for the subsequent passes.

2. The flash memory device of claim 1, wherein the first volatile memory is on a same chip as the flash memory controller.

3. The flash memory device of claim 1, wherein the second volatile memory is not on the same chip as the first volatile memory.

4. The flash memory device of claim 1, wherein the first volatile memory is smaller in capacity than the second volatile memory.

5. The flash memory device of claim 1, wherein the first volatile memory is a static random access memory (SRAM).

6. The flash memory device of claim 1, wherein the second volatile memory is a dynamic random access memory (DRAM).

7. The flash memory device of claim 1, wherein the M is 3 and the plurality of M-level cells include triple level cells (TLCs).

8. The flash memory device of claim 1, wherein the encoder channel includes an error correction code (ECC) encoder.

9. The flash memory device of claim 1, wherein the encoder channel includes a low density parity check (LDPC) encoder and the encoded data includes an LDPC parity.

10. The flash memory device of claim 1, further comprising a buffer manager communicatively coupled to the first volatile memory and to the second volatile memory, wherein the buffer manager is configured to receive instructions from the flash memory controller for communicating with the first volatile memory and the second volatile memory.

11. A method comprising:
receiving, by a processor, a request from a host system with data to be written into a flash memory, wherein the data is stored in a first volatile memory, wherein the flash memory includes a flash memory block comprising a plurality of pages, each page comprising a plurality of M-level cells, wherein each page of data is programmed into the flash memory in multiple passes by writing a same page of data to a respective page of the plurality of M-level cells of the flash memory for each of the multiple passes;
communicating with a buffer manager, communicatively coupled to the processor, to read the data stored in the first volatile memory for a first pass, wherein the buffer manager sends the data read from the first volatile memory through an encoder channel to generate encoded data for programming into the flash memory for the first pass;
communicating with the buffer manager to store the encoded data in a second volatile memory to be used for programming into the flash memory for subsequent passes after the first pass, wherein the programming of the encoded data into the flash memory for the first pass is performed by bypassing the second volatile memory; and communicating with the buffer manager to read the encoded data from the second volatile memory to program the flash memory for the subsequent passes, wherein the buffer manager sends the encoded data to the flash memory through a bypass channel.

12. The method of claim 11, wherein the buffer manager stores the encoded data in the second volatile memory through a write back channel.

13. The method of claim 11, wherein once the encoded data is stored in the second volatile memory, the first volatile memory is released for next data transfer with the host system.

14. The method of claim 11, wherein the M is 3 and the plurality of M-level cells include triple level cells (TLCs).

15. The method of claim 11, wherein the first volatile memory is a static random access memory (SRAM) and the second volatile memory is a dynamic random access memory (DRAM).

16. The method of claim 11, wherein the first volatile memory is on a same chip as the processor, and the second volatile memory is not on the same chip.

17. The method of claim 11, wherein the method is performed by a flash memory controller for a flash memory device.

18. A non-transitory computer readable medium having stored thereon instructions that, when executed by a processor, perform a method, comprising:

receiving a request from a host system with data to be written into a flash memory, wherein the data is stored in a first volatile memory, wherein the flash memory includes a flash memory block comprising a plurality of pages, each page comprising a plurality of M-level cells, wherein each page of data is programmed into the flash memory in multiple passes by writing a same page of data to a respective page of the plurality of M-level cells of the flash memory for each of the multiple passes;

communicating with a buffer manager, communicatively coupled to the processor, to read the data stored in the first volatile memory, wherein the buffer manager sends the data read from the first volatile memory through an encoder channel to generate encoded data for programming into the flash memory for the first pass, wherein the programming of the encoded data into the flash memory for the first pass is performed by bypassing the second volatile memory;

communicating with the buffer manager to store the encoded data in a second volatile memory to be used for programming into the flash memory for subsequent passes after the first pass; and communicating with the buffer manager to read the encoded data from the second volatile memory to program the flash memory for the subsequent passes, wherein the buffer manager sends the encoded data to the flash memory through a bypass channel.

19. The non-transitory computer readable medium of claim 18, wherein the processor is part of a flash memory controller for a flash memory device.

20. The non-transitory computer readable medium of claim 19, wherein the M is 3 and the plurality of M-level cells include triple level cells (TLCs).

* * * * *